(12) United States Patent
Harashima (10) Patent No.: US 8,773,883 B2
(45) Date of Patent: Jul. 8, 2014

(54) SYSTEM AND MEMORY MODULE

(76) Inventor: Shiro Harashima, Tokyo (JP)

(*) Notice: Subject to any disclaimer, the term of this patent is extended or adjusted under 35 U.S.C. 154(b) by 0 days.

(21) Appl. No.: 13/610,282

(22) Filed: Sep. 11, 2012

(65) Prior Publication Data

US 2013/0063998 A1 Mar. 14, 2013

(30) Foreign Application Priority Data

Sep. 13, 2011 (JP) ................. 2011-199466

(51) Int. Cl.
*G11C 5/06* (2006.01)
*G06F 13/00* (2006.01)
*G06F 12/06* (2006.01)

(52) U.S. Cl.
CPC *G11C 5/06* (2013.01); *G11C 5/063* (2013.01); *G06F 12/06* (2013.01); *G06F 12/0623* (2013.01)
USPC .......... 365/63; 365/51; 361/679.32; 361/728; 711/5

(58) Field of Classification Search
CPC .......... G11C 5/06; G11C 5/063; G06F 12/06; G06F 12/0623
USPC ............... 365/51, 63; 711/5; 361/679.32, 728
See application file for complete search history.

(56) References Cited

U.S. PATENT DOCUMENTS

| 6,446,158 | B1 * | 9/2002 | Karabatsos ................. 711/5 |
| 7,562,271 | B2 | 7/2009 | Shaeffer et al. |
| 7,685,364 | B2 | 3/2010 | Shaeffer et al. |
| 8,108,607 | B2 | 1/2012 | Shaeffer et al. |
| 2007/0073942 | A1 * | 3/2007 | Gregorius et al. ............. 710/71 |
| 2011/0228614 | A1 | 9/2011 | Shaeffer et al. |

FOREIGN PATENT DOCUMENTS

JP 2010-524089 A 7/2010

* cited by examiner

*Primary Examiner* — Ly D Pham
(74) *Attorney, Agent, or Firm* — Foley & Lardner LLP

(57) ABSTRACT

A system includes: a controller, a first memory module connected to the controller through a first data bus, and a second memory module connected to the controller through a second data bus, wherein the first memory module includes: first and second memory chips; a first data terminal connected to the first data bus, and a first switch unit that electrical connects the first data terminal with either the first memory chip and the second memory chip, and the second module includes: third and fourth memory chips; a second data terminal connected to the second data bus, and a second switch unit that switches over electrical connection of the second data terminal with either the third memory chip or the fourth memory chip.

19 Claims, 9 Drawing Sheets

SYSTEM AND MEMORY MODULE

REFERENCE TO RELATED APPLICATION

This application is based upon and claims the benefit of the priority of Japanese patent application No. 2011-199466, filed on Sep. 13, 2011, the disclosure of which is incorporated herein in its entirety by reference thereto.

The present invention relates to a system and a memory module included in the system.

BACKGROUND

1. Technical Field

Each of FIGS. 1 and 9A and 9B of Patent Literature 1 describes a memory module including buffers, for example. Provision of the buffer between each memory on the memory module and a controller not shown in Patent Literature 1 allows signal quality between the memory and the controller to be maintained at a high level.

JP Patent Kohyou Publication No. JP2010-524089A, which corresponds to US2008/080261A1, U.S. Pat. No. 7,562,271B2, US2011/228614A1, US2010/146199A1, U.S. Pat. No. 8,108,607B2, US2009/198924A1 and U.S. Pat. No. 7,685,364B2

2. Discussion of Related Art

The entire disclosures of the above mentioned Patent Literature are incorporated herein by reference thereto. The following analyses are given by the present invention.

As indicated in Patent Literature 1, it is extremely important to enhance the signal quality between the memory chip and the controller in the system, in terms of system design. Specifically, due to lower-voltage/higher-speed operation in recent years, the size of a so-called data eye decreases. Accordingly, a system with a higher signal quality is demanded.

It is one idea to perform buffering between the controller and the memory chip in order to enhance the signal quality, as described in Patent Literature 1. However, as will be described below in detail, it is desirable to also cope with signal quality degradation caused by a stub created when wiring is branched.

Figure 9:
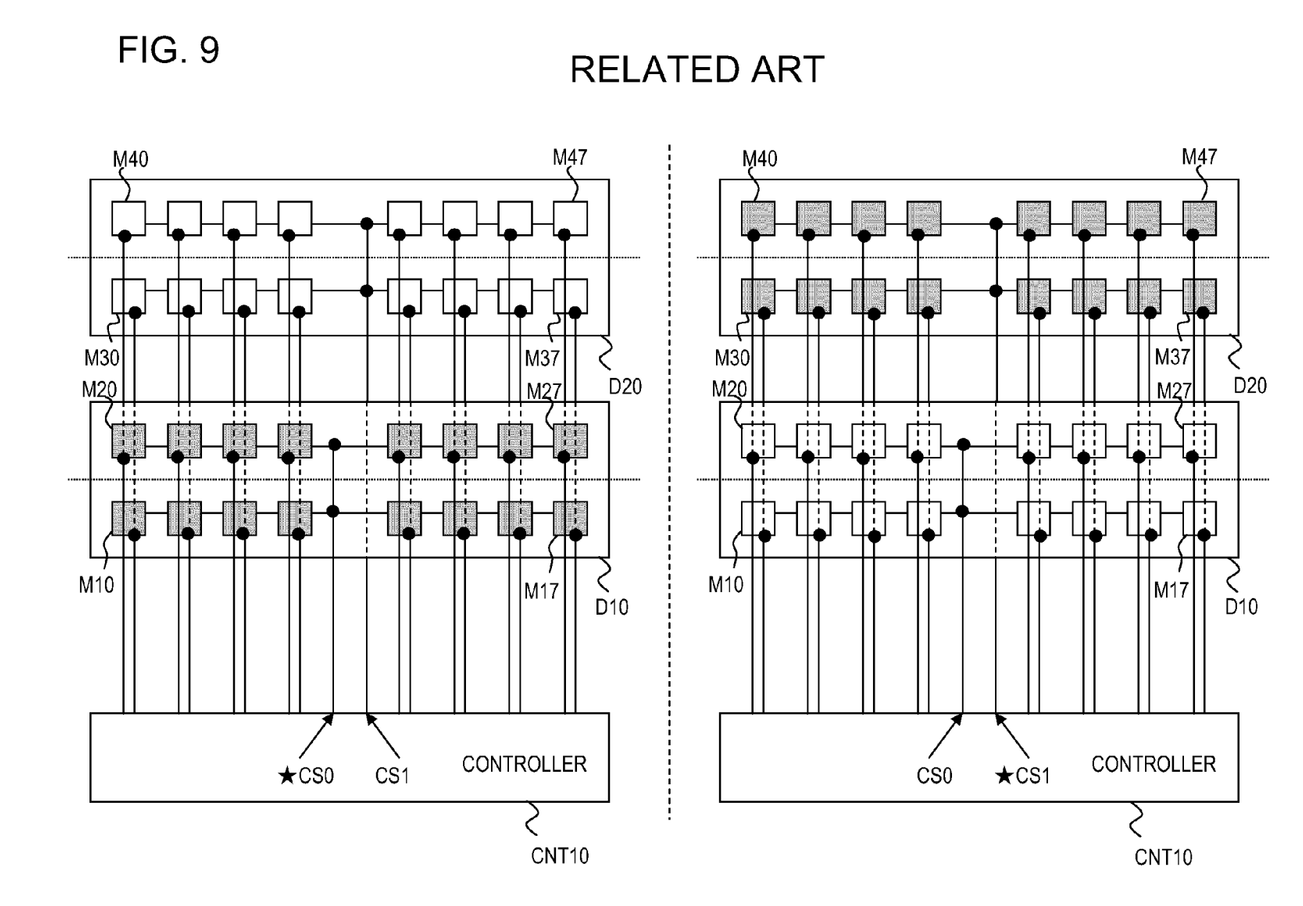
FIG. 9 is a diagram for explaining an operation of a system in a related art.

A configuration and operation of a system using a DIMM (Dual Inline Memory Module) studied by the inventor of the present invention will be described with reference to FIG. 9. FIG. 9 shows a system using two memory modules D10 and D20.

Referring to FIG. 9, a plurality of memory chips are mounted on both sides of a module substrate of each of the memory modules D10 and D20. Memory chips M10 to M17 are mounted on one side of the module substrate of the memory module D10, and memory chips M20 to M27 are mounted on the other surface of the module substrate of the memory module D10. Similarly, memory chips M30 to M37 are mounted on one side of the module substrate of the memory module D20, and memory chips M40 to M47 are mounted on the other surface of the module substrate of the memory module D20. Buses of the controller CNT10 (which are 64 buses) are connected in common to the two memory modules D10 and D20.

The memory module D10 and the memory module D20 selectively operate due to activation of a chip select signal CS0 (shown in the diagram in the left side of FIG. 9) and a chip select signal CS1 (shown in the diagram in the right side of FIG. 9), respectively. When the chip select signal CS0 is activated, 16 memory chips M10 to M17 and M20 to M27 indicated in gray color (and mounted on both sides of the memory module D10) are activated. Assume that there are 4 DQ terminals per chip, in this case. Then, data at 64 data terminals are all accessed. On this occasion, the memory module D20 which operates according to activation of the chip select signal CS1 does not operate.

In the configuration shown in FIG. 9, data buses of the memory chips M30 to M37 and the memory chips M40 to M47 mounted on the memory module 20 which operates according to activation of the chip select signal CS1 are branched/connected, through the memory chips M30 to M37 and M40 to M47 are not accessed. Accordingly, there are long stubs. Signal reflection may thereby occur, leading to signal quality degradation.

Then, by providing buffers on each of the memory modules D10 and D20 as described in Patent Literature 1, signal quality can be improved more than in the configuration shown in FIG. 9. However, even if the buffers are provided, there is still a problem that signal quality degradation caused by a stub cannot be solved.

SUMMARY

According to a first aspect of the present disclosure there is provided a system comprising: a controller; a first memory module connected to the controller through a first data bus; and a second memory module connected to the controller through a second data bus that is electrically disconnected from the first data bus. The first memory module comprises: a first memory chip and a second memory chip; a first data terminal connected to the first data bus; and a first switch unit that switches over electrical connection of the first data terminal with either the first memory chip or the second memory chip. The second memory module comprises: a third memory chip and a fourth memory chip; a second data terminal connected to the second data bus; and a second switch unit that switches over electrical connection of the second data terminal with either the third memory chip or the fourth memory chip.

According to a second aspect of the present disclosure there is provided a memory module included in a system that includes a controller, a first memory module connected to the controller through a first data bus, and a second memory module connected to the controller through a second data bus that is electrically disconnected from the first data bus. The memory module is the first memory module which comprises: a first memory chip and a second memory chip; a data terminal connected to the first data bus; and a switch unit that switches over electrical connection of the data terminal with either the first memory chip or the second memory chip.

The present disclosure provides the following advantage, but not restricted thereto. According to the system and the memory module(s) of the present disclosure, when the first memory chip is connected to the first data terminal through the first switch unit, for example, only the first switch unit is connected to the first data buses, and the second memory chip and the first data buses are electrically disconnected. Similarly, when the second memory chip is connected to the first data terminal through the first switch unit, only the second memory chip is connected to the first data buses, and the first memory chip and the first data buses are electrically disconnected. Thus, according to the system and the memory module(s) of the present disclosure, no branching of wiring occurs in the middle of the data buses connecting the memory chip and the controller. A high signal quality can be achieved between the memory chip and the controller.

BRIEF DESCRIPTION OF THE DRAWINGS

The above features and advantages of the present invention will be more apparent from the following description of certain preferred embodiments taken in conjunction with the accompanying drawings, in which.

PREFERRED MODES

In the present disclosure, there are various possible modes, which include the following, but not restricted thereto. First, an outline of the present disclosure will be described. Reference symbols written in brackets in the drawings, which will be described in this outline, are illustrated only for helping understanding, and are not intended to limit the present disclosure to a mode shown in the drawings.

Figure 3:
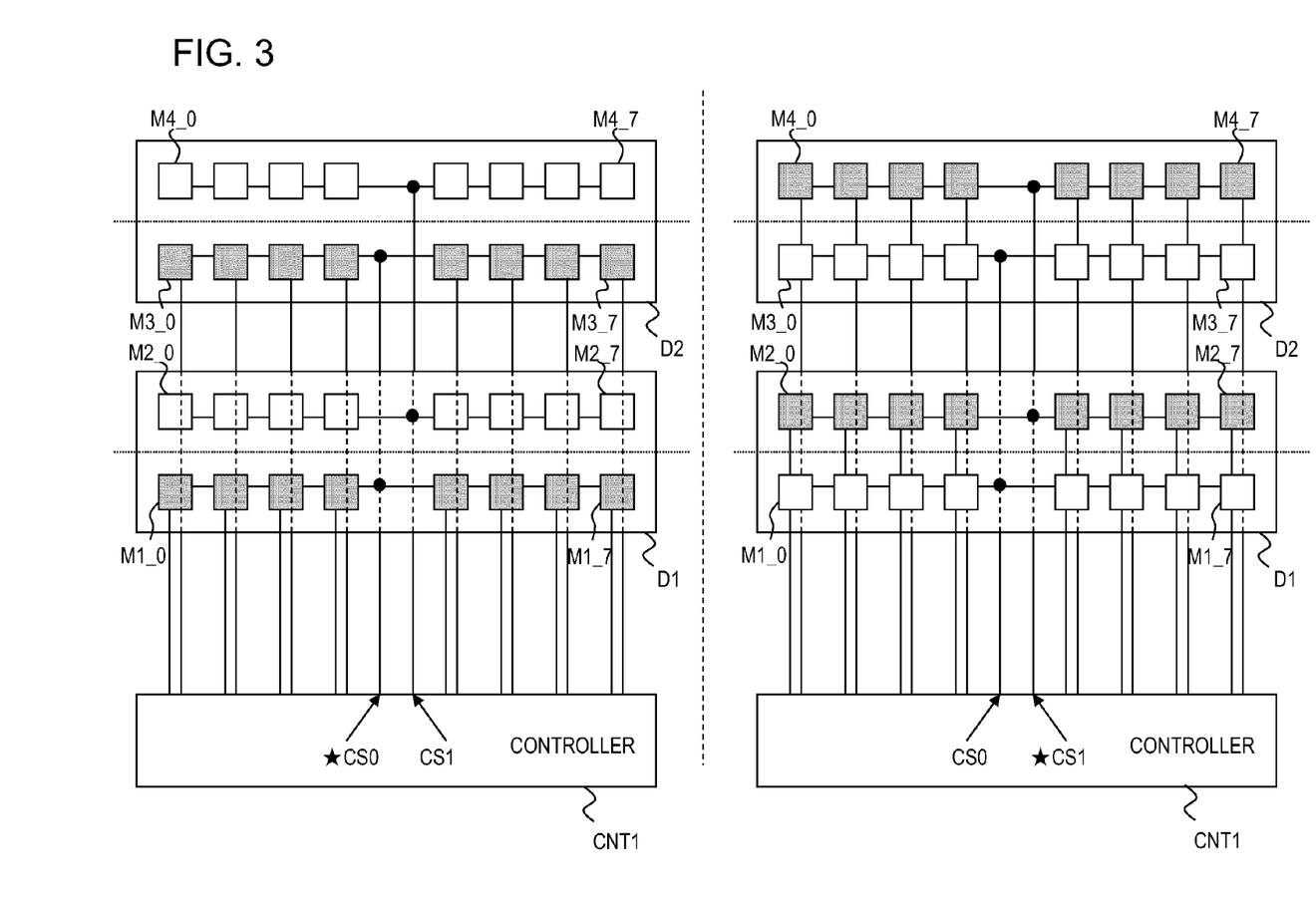
FIG. 3 is a diagram for explaining an operation of the system according to the first exemplary embodiment.

The inventor of the present invention has found the following: by performing point-to-point connection for each of memory modules (D1, D2) (using a half of the whole number of buses, or 32 buses for each memory module in the case of FIG. 3), and then by selecting a plurality of memory chips (M1_0 to M1_7, M2_0 to M2_7, M3_0 to M3_7, M4_0 to M4_7) mounted on the memory modules (D1, D2) by switch units (not shown) to access eight memory chips for each memory module as shown in FIG. 3, signal quality degradation by a stub can be prevented.

Referring to FIG. 3, by activation of a chip select signal (CS0) (shown in the diagram in the left side of FIG. 3), the memory chips (M1_0 to M1_7) mounted on the memory module (D1) and the memory chips (M3_0 to M3_7) mounted on the memory module (D2) operate, and the memory chips (M2_0 to M2_7) mounted on the memory module (D1) and the memory chips (M4_0 to M4_7) mounted on the memory module (D2) do not operate.

On the other hand, by activation of a chip select signal (CS1) (shown in the diagram in the right side of FIG. 3), the memory chips (M2_0 to M2_7) mounted on the memory module (D1) and the memory chips (M4_0 to M4_7) mounted on the memory module (D2) operate, and the memory chips (M1_0 to M1_7) mounted on the memory module (D1) and the memory chips (M3_0 to M3_7) mounted on the memory module (D2) do not operate.

Different from the system shown in FIG. 9 as the related art, data bus branching does not occur, when the chip select signal (CS0) or the chip select signal (SC1) is activated. Accordingly, signal quality degradation between each memory chip and the controller can be prevented.

Though buffering is not essential in the configuration of the system shown in FIG. 3, signal quality can be further improved by performing buffering as described in Patent Literature 1, together with the arrangement described above.

The system according to the present disclosure will be described below in further detail, with reference to the drawings.

Figure 2:
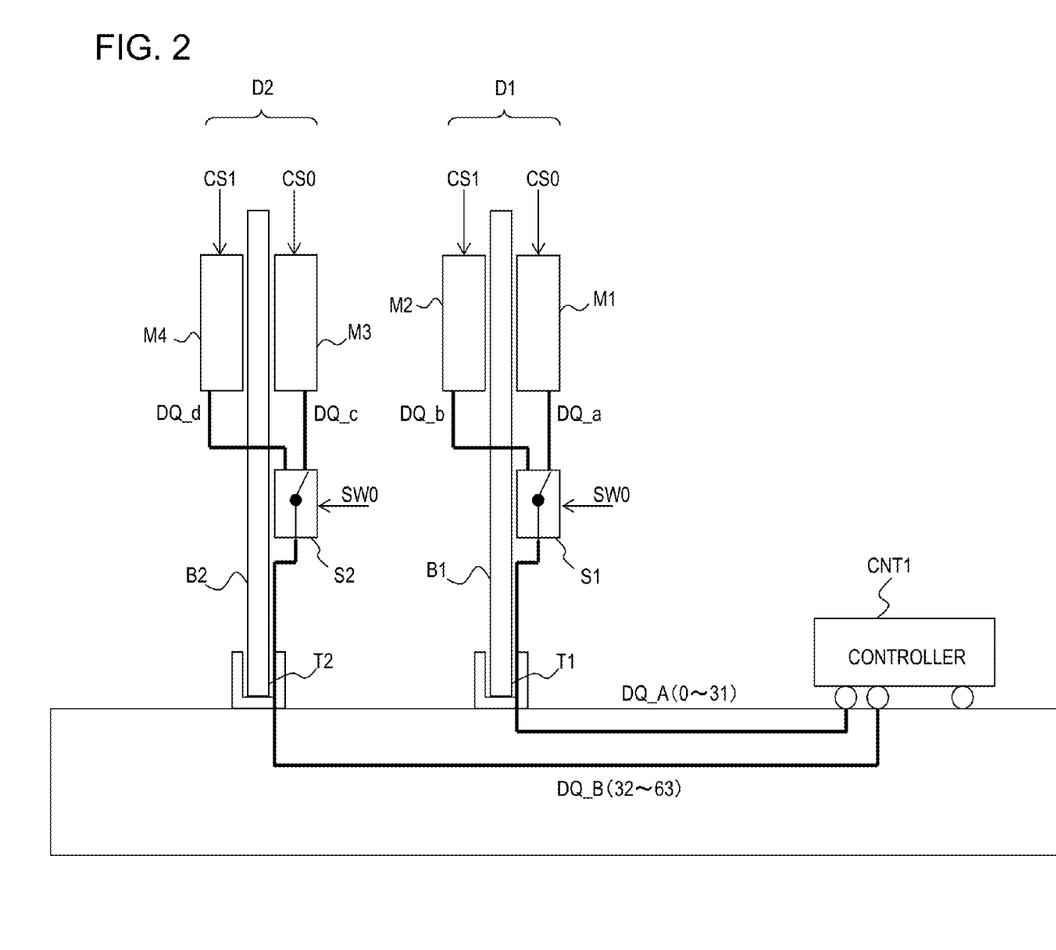
FIG. 2 is a diagram showing, as an example, the configuration of the system according to the first exemplary embodiment.

Referring to FIG. 2, the system according to the present disclosure may include a controller (CNT1), a first memory module (D1) connected to the controller through a first data bus (DQ_A), and a second memory module (D2) connected to the controller (CNT1) through a second data bus (DQ_B) that is electrically disconnected from the first data bus (DQ_A). The first memory module (D1) may include a first memory chip (M1) and a second memory chip (M2), a first data terminal (T1) connected to the first data bus (DQ_A), and a first switch unit (S1) that switches over electrical connection of the first data terminal (T1) with either the first memory chip (M1) or the second memory chip (M2). The second memory module (D2) may include a third memory chip (M3) and a fourth memory chip (M4), a second data terminal (T2) connected to the second data bus (DQ_B), and a second switch unit (S2) that switches over electrical connection of the second data terminal (T2) with either the third memory chip (M3) or the fourth memory chip (M4).

Referring to FIG. 2, the first memory module (D1) may have the first memory chip (M1) on a first surface of a first module substrate (B1) and the second memory chip (M2) on a second surface of the first module substrate (B1). The second memory module (D2) may have the third memory chip (M3) on a first surface of a second module substrate (B2) and the fourth memory chip (M4) on a second surface of the second module substrate (B2). Further, the first memory module (D1) may have the first data terminal (T1) on the first surface of the first module substrate (B1), and the second memory module (D2) may have the second data terminal (T2) on the first surface of the second module substrate (B2). Further, the first memory module (D1) may have the first switch unit (S1) between the first memory chip (M1) and the first data terminal (T1), on the first surface of the first module substrate (B1). The second memory module (D2) may have the second switch unit (S2) between the third memory chip (M3) and the second data terminal (T2), on the first surface of the second module substrate (B2).

The first switch unit (S1) may have a function of buffering data to be exchanged between the controller (CNT1) and the first memory chip (M1) or the second memory chip (M2). The second switch unit (S2) may have a function of buffering data to be exchanged between the controller (CNT1) and the third memory chip (M3) or the fourth memory chip (M4).

When the first chip select signal (CS0) is active, the first memory chip (M1) and the third memory chip (M3) may operate. When the second chip select signal (CS1) is active, the second memory chip (M2) and the fourth memory chip (M4) may operate. When one of the first chip select signal (CS0) and the second chip select signal (CS1) is active, the other may be inactive.

Figure 1:
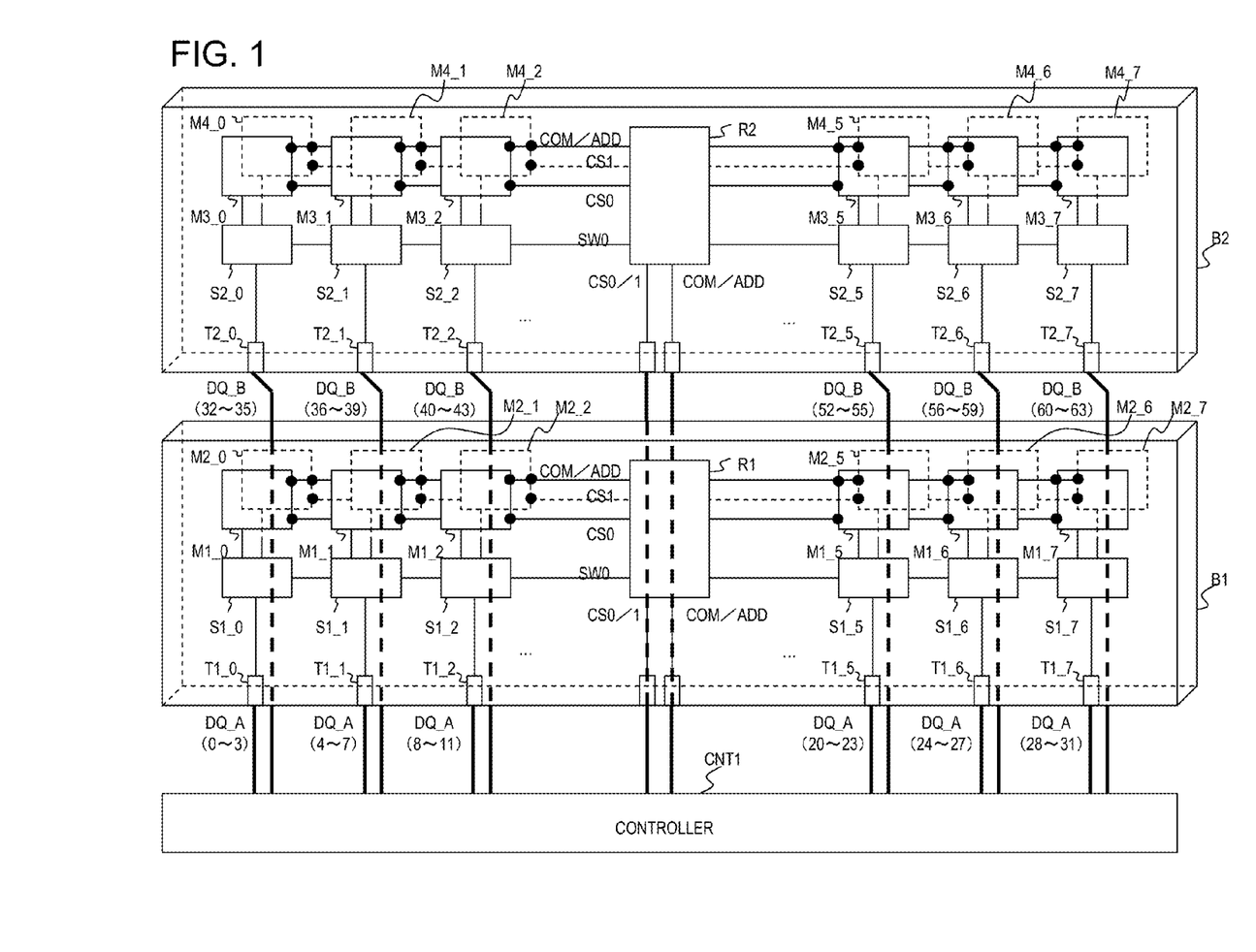
FIG. 1 is a diagram showing, as an example, a configuration of a system according to a first exemplary embodiment.

Referring to FIG. 1, the first memory module (D1) and the second memory module (D2) may respectively include registers (R1, R2) each of which buffers a command/address signal.

Figure 4:
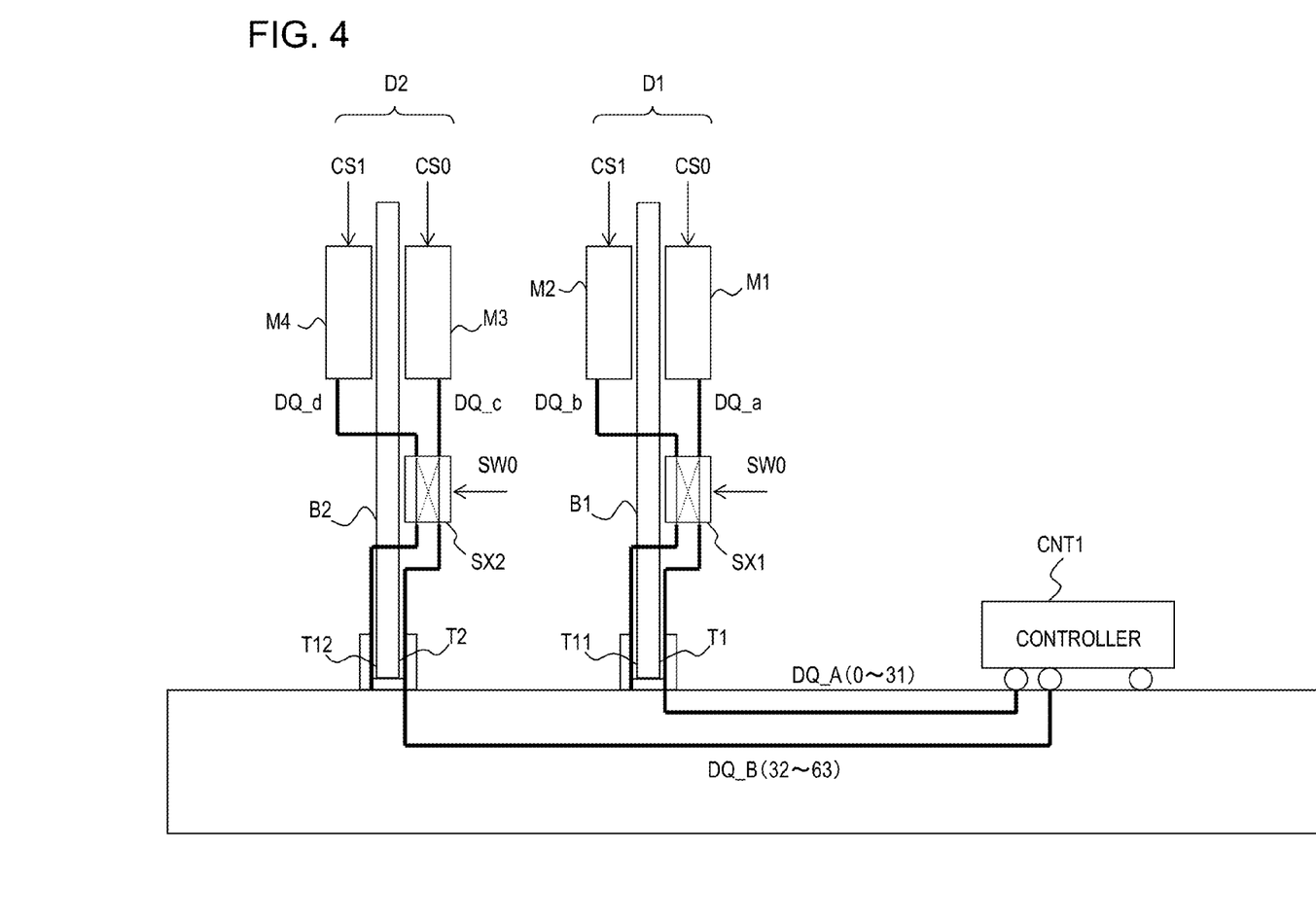
FIG. 4 is a diagram showing, as an example, a configuration of a system according to a second exemplary embodiment.
Figure 5:
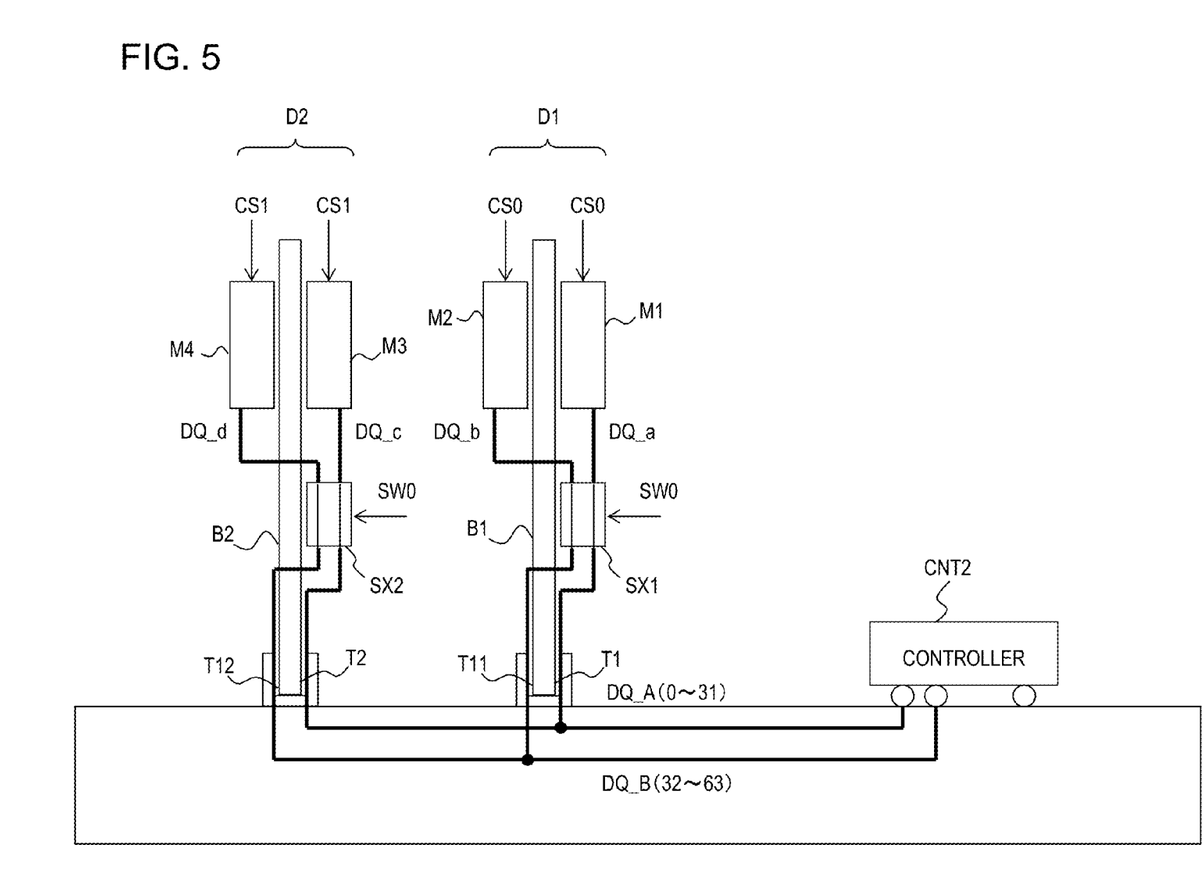
FIG. 5 is a diagram showing, as an example, a configuration of the system according to the second exemplary embodiment.

Referring to FIGS. 4 and 5, a first switch unit (SX1) may be a cross-bus switch that electrically connects one of the first memory chip (M1) and the second memory chip (M2) to the first data terminal (T1) and the other to a data terminal (T11) that is electrically connectable to the second data bus (DQ_B). A second switch unit (SX2) may be a cross-bus switch that electrically connects one of the third memory chip (M3) and the fourth memory chip (M4) to the second data terminal (T2) and the other to a data terminal (T12) that is electrically connectable to the first data bus (DQ_A).

Figure 6:
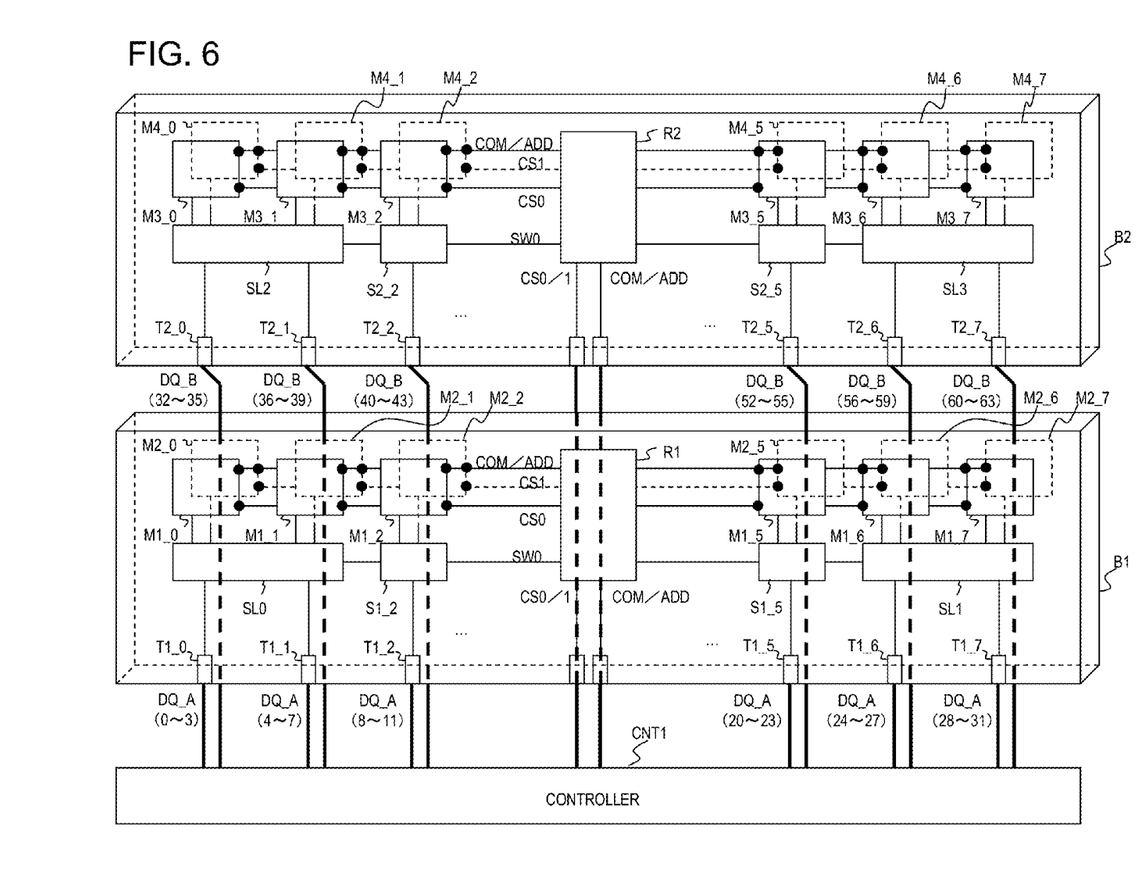
FIG. 6 is a diagram showing, as an example, a configuration of a system according to a third exemplary embodiment.

Referring to FIG. 6, the first memory module (D1) may comprise a plurality of the first memory chips (M1_0, M1_1) and a plurality of the second memory chips (M2_0, M2_1), and a plurality of the first data terminals (T1_0, T1_1). A first switch unit (SL0) may electrically connect the plurality of the first data terminals (T1_0, T1_1) with either the plurality of the first memory chips (M1_0, M1_1) or the plurality of the second memory chips (M2_0, M2_1).

Figure 7:
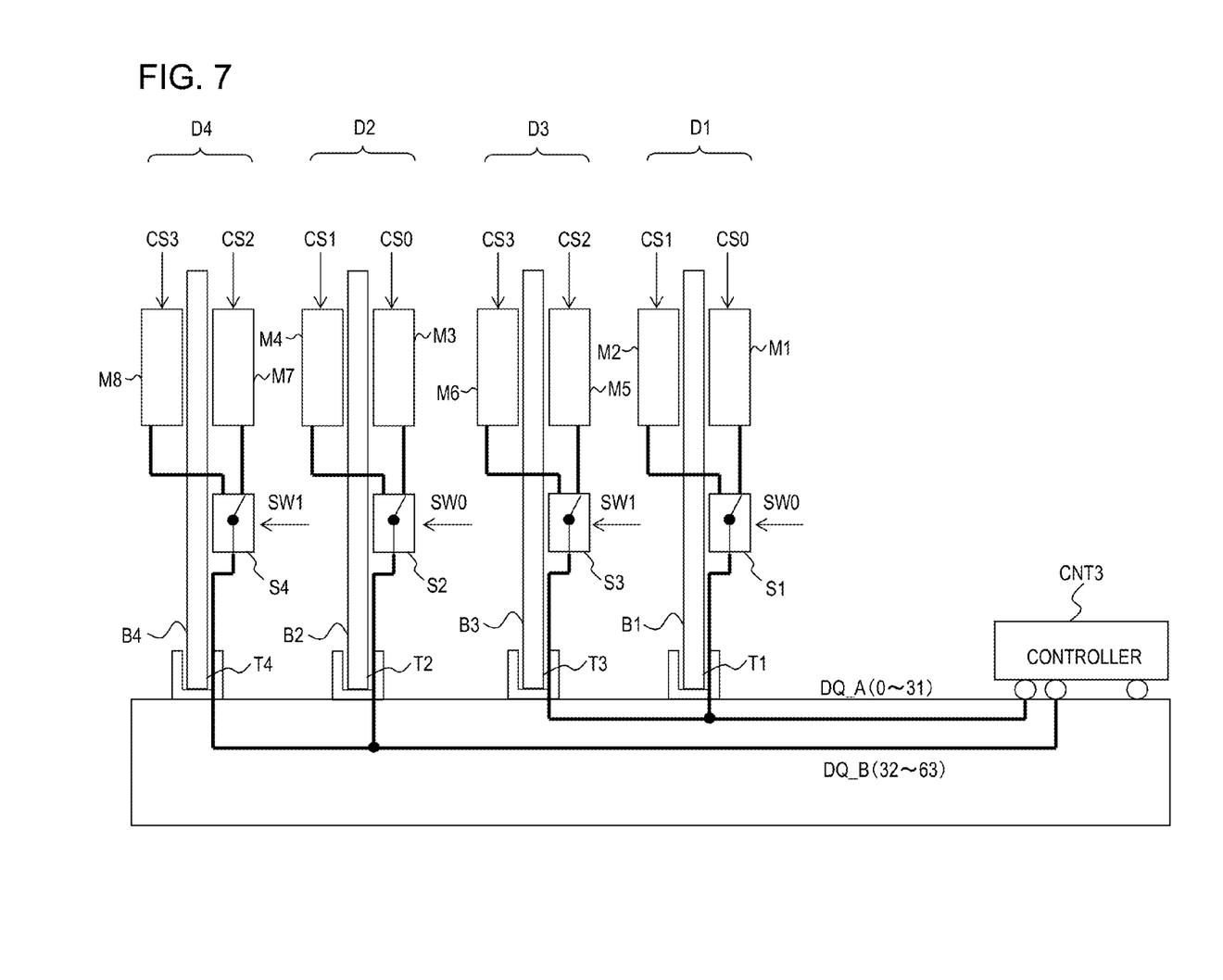
FIG. 7 is a diagram showing, as an example, a configuration of a system according to a fourth exemplary embodiment.

Referring to FIG. 7, the system may further comprise: a third memory module (D3) connected to a controller (CNT3) through the first data bus (DQ_A); and a fourth memory module (D4) connected to the controller (CNT3) through the second data buses (DQ_B). The third memory module (D3) may comprise: a fifth memory chip (M5) and a sixth memory chip (M6); a third data terminal (T3) connected to the first data bus (DQ_A); and a third switch unit (S3) that switches over electrical connection of the third data terminal (T3) with either the fifth memory chip (M5) or the sixth memory chip (M6). The fourth memory module (D4) may comprise: a seventh memory chip (M7) and an eighth memory chip (M8); a fourth data terminal (T4) connected to the second data bus (DQ_B); and a fourth switch unit (S4) that switches over electrical connection of the fourth data terminal (T4) with either the seventh memory chip (M7) or the eighth memory chip (M8).

According to the system of the present disclosure, when the first memory chip (M1) is connected to the first data terminal (T1) through the first switch unit (S1), for example, only the first switch unit (S1) is connected to the first data bus (DQ_A), and the second memory chip (M2) is electrically disconnected from the first data bus (DQ_A). Similarly, when the second memory chip (M2) is connected to the first data terminal (T1) through the first switch unit (S1), only the second memory chip (M2) is connected to the first data bus (DQ_A), and the first memory chip (M1) and the first data bus (DQ_A) are electrically disconnected. Thus, according to the system and the memory modules of the present disclosure, no branching of wiring occurs in the middle of the data bus (DQ_A) connecting the memory chip (M1/M2) and the controller (CNT1). A high signal quality can be implemented between the memory chip (M1/M2) and the controller (CNT1).

First Exemplary Embodiment

A system according to a first exemplary embodiment will be described with reference to the drawings. FIG. 1 is a diagram showing, as an example, a configuration of the system according to the present exemplary embodiment. FIG. 1 is a plan view of the whole of the system. Module substrates are stereoscopically displayed in order to easily see the configuration.

Referring to FIG. 1, the system in the present exemplary embodiment includes a controller CNT1 and two memory modules. A first memory module includes memory chips M1_0 to M1_7, data terminals T1_0 to T1_7, switch units S1_0 to S1_7, and a register R1 on the front surface of a module substrate B1. The first memory module includes memory chips M2_0 to M2_7 on the back surface of the module substrate B1. Similarly, a second memory module includes memory chips M3_0 to M3_7, data terminals T2_0 to T2_7, switch units S2_0 to S2_7, and a register R2 on the front surface of a module substrate B2. The second module includes memory chips M4_0 to M4_7 on the back surface of the module substrate B2.

The data terminal T1_0 provided on the front surface of the module substrate B1 is connected to data buses DQ_A (0 to 3). Similarly, the data terminals T1_1 to T1_7 are respectively connected to data buses DQ_A (4 to 7) to data buses DQ_A (28 to 31). On the other hand, the data terminal T2_0 provided on the front surface of the module substrate B2 is connected to the data buses DQ_B (32 to 35). Similarly, the data terminals T2_1 to T2_7 are respectively connected to data buses DQ_B (36 to 39) to data buses DQ_B (60 to 63).

The registers R1 and R2 are respectively provided on substantially central portions of the memory modules D1 and D2. Each of the registers R1 and R2 buffers an input signal (command/address signal COM/ADD) and then supplies the input signal to each memory chip.

The register R1 provided on the front surface of the module substrate B1 receives a chip select signal CS0/1 and the command/address signal COM/ADD from the controller CNT1. The register R1 outputs the chip select signal CS0 to the memory chips M1_0 to M1_7 provided on the front surface of the module substrate B1, outputs the chip select signal CS1 to the memory chips M2_0 to M2_7 provided on the back surface of the module substrate B1, outputs the command/address signal to each memory chip on the module substrate B1, and outputs a switch signal SW0 to the switch units S1_0 to S1_7.

The register R2 provided on the front surface of the module substrate B2 receives the chip select signal CS0/1 and the command/address signal COM/ADD from the controller CNT1. The register R2 outputs the chip select signal CS0 to the memory chips M3_0 to M3_7 provided on the front surface of the module substrate B2, outputs the chip select signal CS1 to the memory chips M4_0 to M4_7 provided on the back surface of the module substrate B2, outputs the command/address signal to each memory chip on the module substrate B2, and outputs the switch signal SW0 to the switch units S2_0 to S2_7.

When the chip select signal CS0 output from the register R1 is active, the memory chips M1_0 to M1_7 provided on the front surface of the module substrate B1 operate according to the command/address signal COM/ADD output from the register R1. On the other hand, when the chip select signal CS1 output from the register R1 is active, the memory chips M2_0 to M2_7 provided on the back surface of the module substrate B1 operate according to the command/address signal COM/ADD output from the register R1. When one of the chip select signals CS0 and CS1 is active, the other of the chip select signals CS0 and CS1 is inactive.

When the chip select signal CS0 output from the register R2 is active, the memory chips M3_0 to M3_7 provided on the front surface of the module substrate B2 operate according to the command/address signal COM/ADD output from the register R2. On the other hand, when the chip select signal CS1 output from the register R2 is active, the memory chips M4_0 to M4_7 provided on the back surface of the module substrate B2 operate according to the command/address signal COM/ADD output from the register R2.

The switch unit S1_0 provided on the front surface of the module substrate B1 selects one of the memory chip M1_0 provided on the front surface of the module substrate B1 and the memory chip M2_0 provided on the back surface of the module substrate B1 according to the switch signal SW0 output from the register R1, and electrically connects the selected one of the memory chips M1_0 and M2_0 to the data terminal T1_0 connected to the data buses DQ_A (0 to 3). Operations of the switch units S1_1 to S1_7 except the switch unit S1_0 are the same as that of the switch unit S1_0. Thus, explanations of the switch units S1_1 to S1_7 will be omitted.

The switch unit S2_0 provided on the front surface of the module substrate B2 selects one of the memory chip M3_0 provided on the front surface of the module substrate B2 and the memory chip M4_0 provided on the back surface of the module substrate B2 according to the switch signal SW0 output from the register R2, and electrically connects the selected one of the memory chips M3_0 and M4_0 to the data terminal T2_0 connected to the data buses DQ_B (32 to 35). Operations of the switch units S2_1 to S2_7 except the switch unit S2_0 are the same as that of the switch unit S2_0. Thus, explanations of the switch units S2_1 to S2_7 will be omitted.

FIG. 2 is a side view of the whole of the system. For simplification of description, the memory chips M1_0 to M1_7, the memory chips M2_0 to M2_7, the memory chips M3_0 to M3_7, and the memory chips M4_0 to M4_7 (in FIG. 1) are collectively referred to as a memory chip M1, a memory chip M2, a memory chip M3, and a memory chip M4, respectively. Similarly, the data terminals T1_0 to T1_7 and the data terminals T2_0 to T2_7 (in FIG. 1) are collectively referred to as a data terminal T1 and a data terminal T2, respectively. Further, the switch units S1_0 to S1_7 and the switch units S20 to S2_7 (in FIG. 1) are collectively referred to as a switch unit S1 and a switch unit S2, respectively.

Referring to FIG. 2, the memory module D1 is connected to the controller CNT1 through data buses DQ_A. On the other hand, the memory module D2 is connected to the controller CNT1 through data buses DQ_B electrically disconnected from the data buses DQ_A.

The memory module D1 includes the memory chips M1 and M2, the data terminal T1, and the switch unit S1. The memory module D1 includes the memory chip M1 on the front surface of the module substrate B1 and includes the memory chip M2 on the back surface of the module substrate B1. The memory module D1 includes the data terminal T1 on the front surface of the module substrate B1. The memory module D1 includes the switch unit S1 between the memory chip M1 and the data terminal T1, on the front surface of the module substrate B1. The data terminal T1 is connected to the data buses DQ_A.

Similarly, the memory module D2 includes the memory chips M3 and M4, the data terminal T2, and the switch unit S2. The memory module D2 includes the memory chip M3 on the front surface of the module substrate B2 and includes the memory chip M4 on the back surface of the module substrate B2. Similarly, the memory module D2 includes the data terminal T2 on the front surface of the module substrate B2. The memory module D2 includes the switch unit S2 between the memory chip M3 and the data terminal T2, on the front surface of the module substrate B2. The data terminal T2 is connected to the data buses DQ_B.

The switch unit S1 in the memory module D1 switches over electrical connection of the data terminal T1 with either the memory chip M1 or the memory chip M2. The switch unit S1 may have a function of buffering data to be exchanged between the controller CNT1 and the memory chip M1 or M2 (refer to FIG. 8).

Similarly, the switch unit S2 in the memory module D2 switches over electrical connection of the data terminal T2 with either the memory chip M3 or the memory chip M4. The switch unit S2 may have a function of buffering data to be exchanged between the controller CNT1 and the memory chip M3 or M4.

The memory chips M1 and M3 included in a group of the memory chips on the front surface of the memory modules D1 and D2 are activated by the chip select signal CS0. On the other hand, the memory chips M2 and M4 included in a group of the memory chips on the back surface of the memory modules D1 and D2 are activated by the chip select signal CS1. That is, the memory chips M1 and M3 operate when the chip select signal CS0 is active, and the memory chips M2 and M4 operate when the chip select signal CS1 is active. When one of the chip select signals CS0 and CS1 is active, the other of the chip select signals CS0 and CS1 is inactive.

Since the chip select signals CS0 and CS1 are chip select signals that are not simultaneously selected, it seems that switch circuits are not needed. However, when one of data buses DQ_a and DQ_b is short-circuited with no switch circuit interposed therein, branching (stub) occurs in its short-circuited portion. Therefore, by providing the switch unit, branching can be prevented.

Next, a write operation will be taken as an example, and will be described with reference to FIG. 2. When accesses are made to the memory chips M1 and M3 on the front surfaces of the memory modules D1 and D2, the controller CNT1 outputs a write command and data signals (0 to 63), the chip select signal CS0 at low level and the chip select signal CS1 at high level (indicating selection of the memory chips on the front side of both of the memory modules), and the switch signal SW0 at high level (for switching so that the switch units select the memory chips on the front surface of the both of the memory modules). In this case, the switch unit S1 connects the memory chip M1 and the data terminal T1 connected to the data buses DQ_A through the data buses DQ_a. On the other hand, the switch unit S2 connects the memory chip M3 and the data terminal T2 connected to the data buses DQ_B through data buses DQ_c.

On the other hand, when accesses are made to the memory chips M2 and M4 on the back surfaces of the memory modules D1 and D2, the controller CNT1 outputs the chip select signal CS0 at high level and the chip select signal CS1 at low level and the switch signal SW0 at low level. In this case, the switch unit S1 connects the memory chip M2 and the data terminal T1 connected to the data buses DQ_A through the data buses DQ_b, which is opposite to the mode shown in FIG. 2. On the other hand, the switch unit S2 connects the memory chip M4 and the data terminal T2 connected to the data buses DQ_B through data buses DQ_d. Also when a read command is output, the memory chips on the front surfaces or the back surfaces of both of the memory modules D1 and D2 and the data terminals are selected by the method similar to that described above.

According to the configuration of the present exemplary embodiment, no stub is formed in the data buses between the controller CNT1 and each memory chip. A system with a high signal quality can be thereby formed.

Second Exemplary Embodiment

A system according to a second exemplary embodiment will be described, with reference to the drawings. FIG. 4 is a diagram showing a configuration of the system according to the present exemplary embodiment. The system in the present exemplary embodiment is different from the system in the first exemplary embodiment in that 64 data buses are provided for each memory module. The memory module included in the system in the present exemplary embodiment can be used in the system shown in FIG. 9 as the related art, as well.

Referring to FIG. 4, in the system in the present exemplary embodiment, a memory module D1 includes a switch unit SX1. On the other hand, a memory module D2 includes a switch unit SX2. In the system in the present exemplary embodiment, a cross-bus switch is used for each of the switch units SX1 and SX2. In this case, 32 data terminals T1 and 32 data terminals T11 are provided on both front and back surfaces of a module substrate B1 of the memory module D1, and 32 data terminals T2 and 32 data terminals T12 are provided on both front and back surfaces of a module substrate B2 of the memory module D2.

The switch unit SX1 electrically connects one of memory chips M1 and M2 to a data terminal T1 and electrically connects the other of the memory chips M1 and M2 to a data terminal T11 that can be connected to data buses DQ_B. Similarly, the switch unit SX2 electrically connects one of memory chips M3 and M4 to a data terminal T2 and electrically connects the other of the memory chips M3 and M4 to a data terminal T12 that can be connected to data buses DQ_A.

When these memory modules are used in the system that is the same as the system in the first exemplary embodiment and a switch signal SW0 is high, the 32 data terminals T11 and the 32 data terminals T12 on the one surfaces of the module substrates B1 and B2 are electrically disconnected from the data buses. Accordingly, no stub is formed in the system in the present exemplary embodiment, as in the system in the first exemplary embodiment.

FIG. 5 is a diagram showing a state where the memory modules in the present exemplary embodiment are used in the system shown in FIG. 9. In this case, similar control to that in the system shown in FIG. 9 becomes possible. A switch signal SW0 is not present for the existing memory module. However, by connecting a signal line for a voltage VDD to the switch signal SW0, the switch units SX1 and SX2, which are cross-bus switches, can be fixed as shown in FIG. 5. By configuring the memory modules as described above, highly versatile memory modules that can be used in various systems can be provided.

Third Exemplary Embodiment

A system according to a third exemplary embodiment will be described, with reference to the drawings. FIG. 6 is a diagram showing, as an example, a configuration of the system in the present exemplary embodiment. In the first exemplary embodiment (in FIG. 1), one switch unit (including a buffer circuit) is provided for a set of memory chips on the front and back surfaces of each memory module. On the other hand, one switch unit (including a switch circuit/buffer circuit for two chips) is provided for two sets of memory chips on the front and back surfaces of each memory module, for example.

Referring to FIG. 6, one switch unit SL0 is provided for memory chips M1_0 and M1_1 on the front surface of a module substrate B1 and memory chips M2_0 and M2_1 on the back surface of the module substrate B1. Similarly, one switch unit SL1 is provided for memory chips M1_6 and M1_7 on the front surface of the module substrate B1 and memory chips M2_6 and M2_7 on the back surface of the module substrate B1. One switch unit SL2 is provided for memory chips M3_0 and M3_1 on the front surface of a module substrate B2 and memory chips M4_0 and M4_1 on the back surface of the module substrate B2. One switch unit SL3 is provided for memory chips M3_6 and M3_7 on the front surface of the module substrate B2 and memory chips M4_6 and M4_7 on the back surface of the module substrate B2.

According to the configuration of the system in the present exemplary embodiment (shown in FIG. 6), the number of the switch units can be reduced from that in the configuration of the system in the first exemplary embodiment (in FIG. 1). Hence, according to the system in the present exemplary embodiment, the number of components can be reduced by reducing the number of the switch units. The manufacturing cost of the system can be thereby reduced.

Fourth Exemplary Embodiment

A system according to a fourth exemplary embodiment will be described, with reference to drawings. FIG. 7 is a diagram showing a configuration of the system in the present exemplary embodiment. The system in the present exemplary embodiment is equivalent to the system in the first exemplary embodiment including two memory modules D1 and D2 (shown in FIGS. 1 and 2) to which a memory capacity is further added.

Referring to FIG. 7, the system in the present exemplary embodiment further includes two memory modules D3 and D4 in the system in the first exemplary embodiment (shown in FIG. 2).

The memory module D3 is connected to a controller CNT3 through data buses DQ_A. The memory module D3 includes memory chips M5 and M6, a data terminal T3, and a switch unit S3. The data terminal T3 is connected to the data buses DQ_A. The switch unit S3 electrically connects the data terminal T3 with either the memory chip M5 or the memory chip M6.

On the other hand, the memory module D4 is connected to the controller CNT3 through data buses DQ_B. The memory module D4 includes memory chips M7 and M8, a data terminal T4, and a switch unit S4. The data terminal T4 is connected to the data buses DQ_B. The switch unit S4 electrically connects the data terminal T4 with either the memory chip M7 or the memory chip M8.

In the system in the present exemplary embodiment, stubs are present for two of the memory modules (such as the memory modules D1 and D3) which will form a pair. However, compared with a case where chip select signals CS0 to CS3 are respectively assigned to the memory modules and data buses corresponding to the four memory modules are connected, signal quality degradation due to a stub can be reduced in the system in the present exemplary embodiment.

Fifth Exemplary Embodiment

A system according to a fifth exemplary embodiment will be described, with reference to the drawings. In the system in the present exemplary embodiment, each switch unit in the system according to each of the first to fourth exemplary embodiment has a buffering function.

Figure 8:
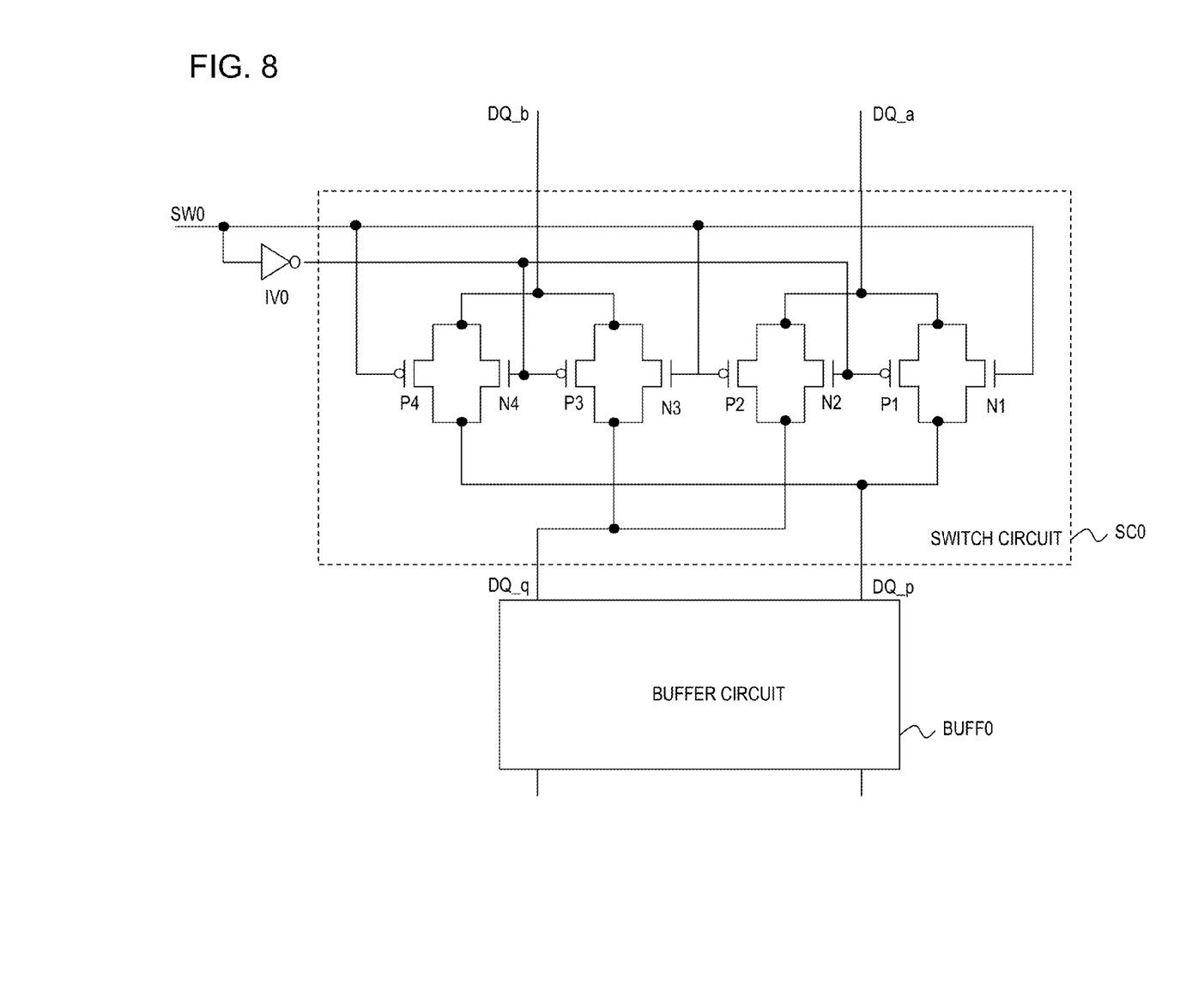
FIG. 8 is a block diagram showing, as an example, a switch unit including a buffer.

FIG. 8 is a block diagram showing a configuration of the switch unit in the system in the second exemplary embodiment (in FIG. 4) to which the buffering function has been given. Referring to FIG. 8, the switch unit includes an inverter IV0, a switch circuit SC0, and a buffer circuit BUFF0.

The switch circuit SC0 includes N-channel transistors N1 to N4 and P-channel transistors P1 to P4. The switch circuit SC0 is a cross-bus switch for switching a data flow between data buses DQ_a and DQ_b and between data buses DQ_p and DQ_q. According to a switch signal SW0, the switch circuit SC0 performs switching so as to establish electrical connection between the data buses DQ_a and DQ_p and electrical connection between the data buses DQ_b and DQ_q, or electrical connection between the data buses DQ_a and DQ_q and electrical connection between the data buses DQ_b and DQ_p.

When the switch signal SW0 is high, the N-channel transistors N1 and N3 turn on, and the P-channel transistors P1 and P3 turn on, and the N-channel transistors N2 and N4 turn off, and the P-channel transistors P2 and P4 turn off. In this case, the data buses DQ_a and DQ_p are electrically connected, and the data buses DQ_b and DQ_q are electrically connected.

On the other hand, when the switch signal SW0 is low, the N-channel transistors N2 and N4 turn on, and the P-channel transistors P2 and P4 turn on, and the N-channel transistors N1 and N3 turn off, and the P-channel transistors P1 and P3 turn off. In this case, the data buses DQ_a and DQ_q are electrically connected, and the data buses DQ_b and DQ_p are electrically connected.

The buffer circuit BUFF0 buffers data to be exchanged through each of the data buses DQ_p and DQ_q.

According to the system in the present exemplary embodiment, branching of wiring in the middle of the data buses connecting each memory chip and the controller is prevented. A high signal quality can be thereby achieved between the memory chip and the controller. In addition, the signal quality can be further improved by the buffering function.

The disclosure of the above Patent Literature is incorporated herein by reference thereto. Modifications and adjustments of the exemplary embodiments are possible within the scope of the overall disclosure (including the claims) of the present invention and based on the basic technical concept of the present invention. Various combinations and selections of various disclosed elements (including each element of each claim, each element of each exemplary embodiment, each element of each drawing, etc.) are possible within the scope of the claims of the present invention. That is, the present invention of course includes various variations and modifications that could be made by those skilled in the art according to the overall disclosure including the claims and the technical concept.

What is claimed is:

1. A system, comprising:
   a controller;
   a first memory module connected to the controller through a first data bus; and
   a second memory module connected to the controller through a second data bus that is electrically disconnected from the first data bus, wherein
   the first memory module comprises:
     a first memory chip and a second memory chip;
     a first data terminal connected to the first data bus; and
     a first switch unit that switches over electrical connection of the first data terminal with either the first memory chip or the second memory chip, and
   the second memory module comprises:
     a third memory chip and a fourth memory chip;
     a second data terminal connected to the second data bus; and
     a second switch unit that switches over electrical connection of the second data terminal with either the third memory chip or the fourth memory chip.

2. The system according to claim 1, wherein
   the first memory module has the first memory chip on a first surface of a first module substrate and the second memory chip on a second surface of the first module substrate; and
   the second memory module has the third memory chip on a first surface of a second module substrate and the fourth memory chip on a second surface of the second module substrate.

3. The system according to claim 2, wherein
   the first memory module has the first data terminal on the first surface of the first module substrate; and
   the second memory module has the second data terminal on the first surface of the second module substrate.

4. The system according to claim 3, wherein
   the first memory module has the first switch unit between the first memory chip and the first data terminal, on the first surface of the first module substrate; and
   the second memory module has the second switch unit between the third memory chip and the second data terminal, on the first surface of the second module substrate.

5. The system according to claim 1, wherein
   the first switch unit has a function of buffering data to be exchanged between the controller and the first memory chip or the second memory chip; and
   the second switch unit has a function of buffering data to be exchanged between the controller and the third memory chip or the fourth memory chip.

6. The system according to claim 1, wherein
   the first memory chip and the third memory chip operate when a first chip select signal is active;
   the second memory chip and the fourth memory chip operate when a second chip select signal is active; and
   when one of the first chip select signal and the second chip select signal is active, the other is inactive.

7. The system according to claim 1, wherein
   each of the first memory module and the second memory module includes a register that buffers a command/address signal.

8. The system according to claim 1, wherein
   the first switch unit is a cross-bus switch that electrically connects one of the first memory chip and the second memory chip to the first data terminal and the other to a data terminal that is electrically connectable to the second data bus, and
   the second switch unit is across-bus switch that electrically connects one of the third memory chip and the fourth memory chip to the second data terminal and the other to a data terminal that is electrically connectable to the first data bus.

9. The system according to claim 1, wherein
   the first memory module comprises a plurality of the first memory chips, a plurality of the second memory chips, and a plurality of the first data terminals; and
   the first switch unit switches over electrical connection of the first data terminals with either the plurality of the first memory chips or the plurality of the second memory chips.

10. The system according to claim 1, further comprising:
    a third memory module connected to the controller through the first data bus; and
    a fourth memory module connected to the controller through the second data bus, wherein
    the third memory module comprises:
      a fifth memory chip and a sixth memory chip;
      a third data terminal connected to the first data bus; and
      a third switch unit that switches over electrical connection of the third data terminal with either the fifth memory chip or the sixth memory chip, and
    the fourth memory module comprises:
      a seventh memory chip and an eighth memory chip;
      a fourth data terminal connected to the second data bus; and
      a fourth switch unit that switches over electrical connection of the fourth data terminal with either the seventh memory chip or the eighth memory chip.

11. A memory module, in a system that includes a controller,
    wherein said memory module includes a first memory module connected to the controller through a first data bus arranged between the first memory module and the controller, and wherein a second memory module is connected to the controller through a second data bus that is electrically disconnected from the first data bus, said first memory module comprising:
a first memory chip and a second memory chip;
a data terminal connected to the first data bus; and
a switch unit that switches over electrical connection of the data terminal with either the first memory chip or the second memory chip.

12. The memory module according to claim 11, wherein the memory module has the first memory chip on a first surface of a module substrate and the second memory chip on a second surface of the module substrate.

13. The memory module according to claim 12, wherein the data terminal is provided on the first surface of the module substrate.

14. The memory module according to claim 13, wherein the switch unit is provided between the first memory chip and the data terminal, on the first surface of the module substrate.

15. The memory module according to claim 11, wherein the switch unit has a function of buffering data to be exchanged between the controller and the first memory chip or the second memory chip.

16. The memory module according to claim 11, wherein
the first memory chip operates when a first chip select signal is active;
the second memory chip operates when a second chip select signal is active; and
when one of the first chip select signal and the second chip select signal is active, the other is inactive.

17. The memory module according to claim 11, further comprising:
a register that buffers a command/address signal.

18. The memory module according to claim 11, wherein
the switch unit is a cross-bus switch that electrically connects one of the first memory chip and the second memory chip to the data terminal and the other to a data terminal that is electrically connectable to the second data bus.

19. The memory module according to claim 11, comprising:
a plurality of the first memory chips, a plurality of the second memory chips, and a plurality of the data terminals;
the switch unit switches over electrical connection of the plurality of the first data terminals with either the plurality of the first memory chips or the plurality of the second memory chips.

* * * * *